(12) United States Patent
Smith

(10) Patent No.: US 6,275,683 B1
(45) Date of Patent: *Aug. 14, 2001

(54) INTERCHANGEABLE SHIELD FOR A RADIO COMMUNICATION DEVICE

(75) Inventor: Stacy Neil Smith, Holly Springs, NC (US)

(73) Assignee: Ericsson Inc., Research Triangle Park, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,644

(22) Filed: Jan. 12, 1998

(51) Int. Cl.[7] ....................................... H04B 1/38
(52) U.S. Cl. ............................. 455/90; 455/300; 361/816
(58) Field of Search ....................... 455/90, 575, 300, 455/301, 117, 128, 351, 347–349; 361/816, 748, 752, 814, 753, 800, 818; 174/35 R; 379/433.01

(56) References Cited

U.S. PATENT DOCUMENTS

| | | | |
|---|---|---|---|
| 3,909,726 | * 9/1975 | Dobrovolny et al. | 455/301 |
| 4,680,676 | * 7/1987 | Petratos et al. | 455/301 |
| 4,928,848 | * 5/1990 | Ballway | 220/444 |
| 5,535,274 | * 7/1996 | Braitberg et al. | 379/446 |
| 5,613,237 | * 3/1997 | Bent et al. | 455/351 |
| 5,613,720 | * 3/1997 | Shaddy | 294/31.2 |
| 5,697,071 | * 12/1997 | Fan | 455/90 |
| 5,731,964 | * 3/1998 | Kitakubo et al. | 455/90 |
| 5,832,371 | * 11/1998 | Thornton | 455/90 |

FOREIGN PATENT DOCUMENTS

| | | | |
|---|---|---|---|
| 0727932A2 | 8/1996 | (EP) . | |
| 2015268 | * 9/1979 | (GB) . | |
| 2-295319 | * 12/1990 | (JP) | 455/300 |
| WO 97/40655 | 10/1997 | (WO) . | |

* cited by examiner

Primary Examiner—Nguyen T. Vo
(74) Attorney, Agent, or Firm—Coats & Bennett, P.L.L.C.

(57) ABSTRACT

An electromagnetic shield for a radiotelephone includes a frame and a shield insert that fits into the frame. The frame comprises a generally rectangular wall structure that forms a part of the housing for the radiotelephone. The shield insert is sized and shaped to fit into the frame and is retained in the frame by friction, interference fit, or snap features. A plurality of interchangeable shield inserts can be made to fit into a standard frame.

15 Claims, 5 Drawing Sheets

INTERCHANGEABLE SHIELD FOR A RADIO COMMUNICATION DEVICE

FIELD OF THE INVENTION

The present invention relates generally to radio communication devices and more particularly, to an electromagnetic shield for shielding a printed circuit board within a radio communication device.

BACKGROUND OF THE INVENTION

Electromagnetic interference is a common and well-known problem in electronic devices such as radio communication devices. Interfering signals can be capacitively coupled (electrostatic coupling) onto wires in the circuit, magnetically coupled to closed loops in the circuit, or electromagnetically coupled to wires acting as small antennas for electromagnetic radiation. Any of these can become a mechanism for coupling of signals from one part of a circuit to another part of a circuit.

One strategy to reduce interfering signals in a radio communication device is to use an electromagnetic shield. In mobile radio communication devices, the electromagnetic shields usually take the form of a frame that is manufactured from die cast magnesium or metalized injection molded plastic. Electromagnetic shields may also be in the form of a sheet metal can that encloses the printed circuit board. The sheet metal can may be soldered to a printed circuit board, or may be held by spring clips which are soldered to the printed circuit board. In either case the soldering step adds to the expense of manufacturing. Moreover, soldering the can to the printed circuit board makes repairs more difficult.

Lids made of die cast metal or metalized plastic are sometimes used in place of shield cans. Die cast metals and injection molded plastics have a practical limit to the thickness that can be processed, currently about 0.50 mm to 0.80 mm. The practical limit imposed by current technology is one of the limiting factors in designing smaller and lighter mobile phones.

Another problem that is often faced when designing electromagnetic shields for mobile phones is the need to compartmentalize areas on the printed circuit board to isolate circuits from one another. This is usually accomplished by using walls to divide the interior of the shield frame into discrete compartments or by using a plurality of cans. For any given mobile phone, the compartments or cans would be arranged so those components that are likely to interfere with one another are isolated. Different models or types of phones are likely to require different shield geometries to isolate components. This greatly increases cost and time needed for producing new variants of mobile phones. Moreover, since these shields are not interchangeable between various models of phones, there is a need to maintain a relatively large number of shields in inventory.

SUMMARY OF THE INVENTION

The present invention is an electromagnetic shield for a radiotelephone. The electromagnetic shield comprises two main components—a frame and a shield insert. The frame is made of metal or plastic and comprises an open wall structure. The shield may be retained in the frame by friction, interference fit, or snap features. The shield insert is significantly thinner and lighter than casting or molding similar features in a rigid component such as a cellular phone frame, thereby providing a mechanical size and weight advantage over existing designs. Further, since the features of the shield insert are non-structural, the present invention obtains advantages in size and weight reduction without sacrificing strength and durability.

Another advantage of the present invention is that the frame can be standardized for a plurality of different models of phones. Any platform specific features can be designed and incorporated into the shield insert that can be fabricated quicker and at lower cost than the frame. This allows new variants of phones to be brought to the market quicker and at less cost. Since the same frame can be used in a plurality of different models, there are fewer parts to maintain in inventory resulting in a further savings in costs. Moreover, the shield of the present invention does not have to be soldered to the printed circuit board. Thus the present invention reduces the cost of manufacturer and makes repairs less difficult.

DETAILED DESCRIPTION OF THE INVENTION

Figure 1:
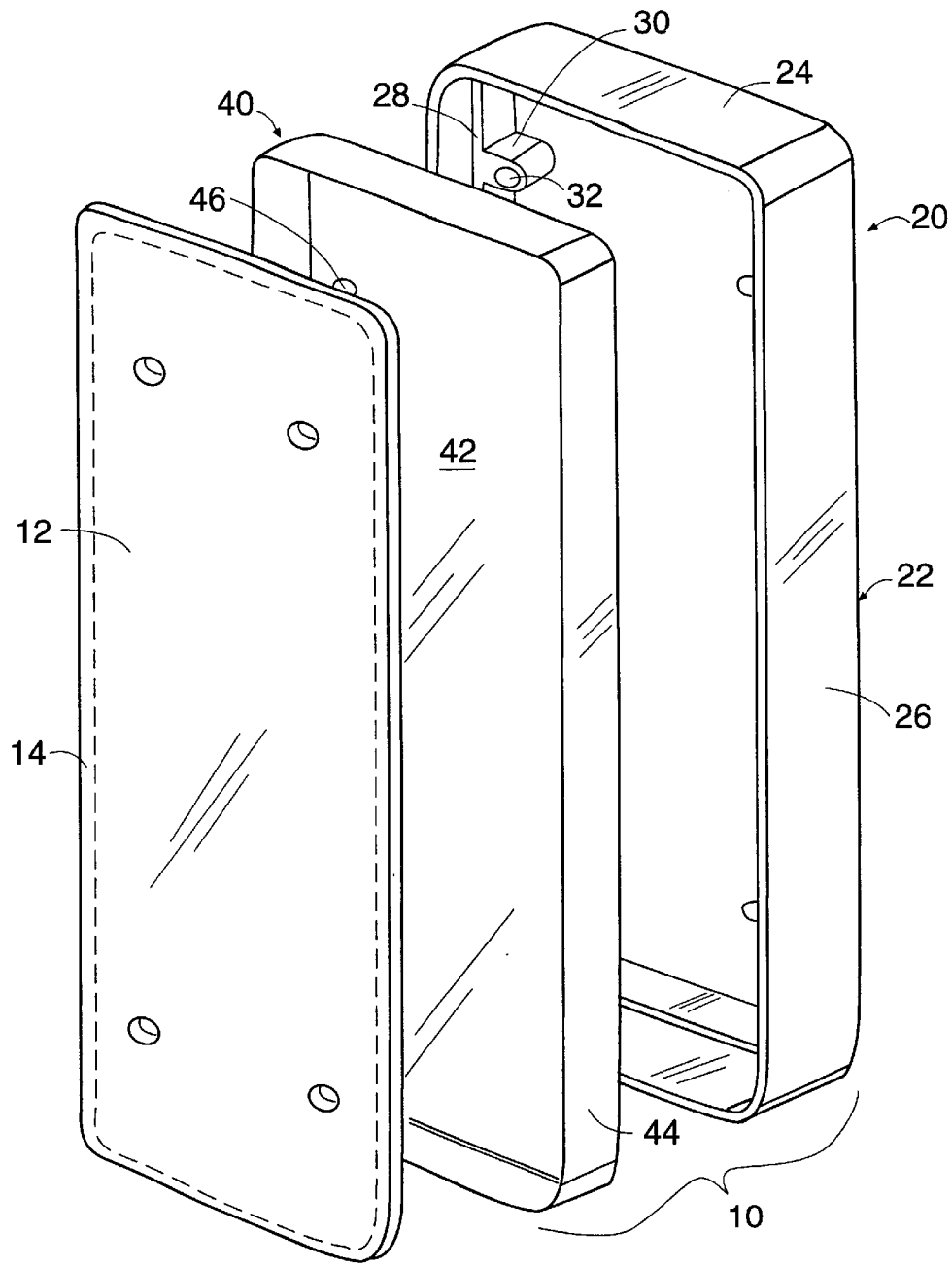
FIG. 1 is an exploded perspective view of the electromagnetic shield of the present invention.
Figure 2:
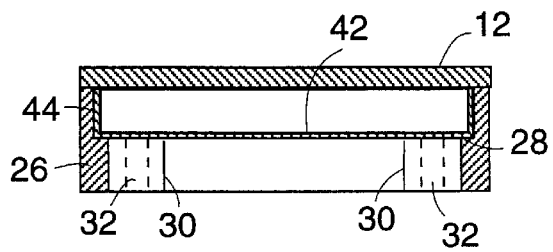
FIG. 2 is a cross section view of the electromagnetic shield.

With reference to the drawings, and particularly to FIGS. 1 and 2, the electromagnetic shield of the present invention is shown therein and indicated generally by the numeral 10. The shield 10 includes a frame 20 and a shield insert 40. The frame 20 serves as a holder for the shield insert 40 that fits inside the frame 20. Once the shield insert 40 is assembled into the frame 20, the entire shield assembly 10 is placed over the top of a printed circuit board 12 containing an electrical circuit which is to be shielded.

The frame 20 comprises a generally rectangular wall structure 22 that forms a four-sided box. The frame is made of die cast magnesium, die cast aluminum, metalized injection-molded plastic, or other conductive materials. The wall structure 22 includes a pair of end walls 24 and a pair of side walls 26. A shoulder 28 is formed on an interior surface of the wall structure 22 approximately midway between the top and bottom edges of the wall structure 22. The purpose of the shoulder 28 is to provide depth location for the shield insert 40 as will be hereinafter described. Four screw sleeves 30 extend inwardly from the inner surface of the wall structure 22. Two screw sleeves 30 are disposed along each side wall 26 adjacent the four corners of the frame 20. The screw sleeves 30 include a through hole 32 to allow passage of a screw. The bottom of the screw sleeve 30 is flush with the bottom edge of the frame 20. The top of the screw sleeve 30 is flush with the shoulder 28.

The shield insert 40 is made of a metal alloy such as a copper beryllium alloy. The shield insert 40 includes a relatively flat bottom wall 42 and a surrounding side wall 44. Thus, the shield insert 40 resembles a shallow pan. Four screw holes 46 are formed in the bottom wall 42 that align with the screw holes 32 in the frame 20.

The shield 10 is sized and shaped to fit into the frame 20 as shown in FIG. 2. The bottom wall 42 of the shield insert 40 rests on the shoulder 28 and screw sleeves 30. Thus, the shoulder 28 and screw sleeves 30 serve to locate the shield insert 40 vertically as shown in FIG. 2. In a preferred embodiment, the side walls 44 of the shield insert 40 press outwardly against the inner surface of the frame 20 to provide frictional engagement between the shield insert 40 and the frame 20.

Figure 3:
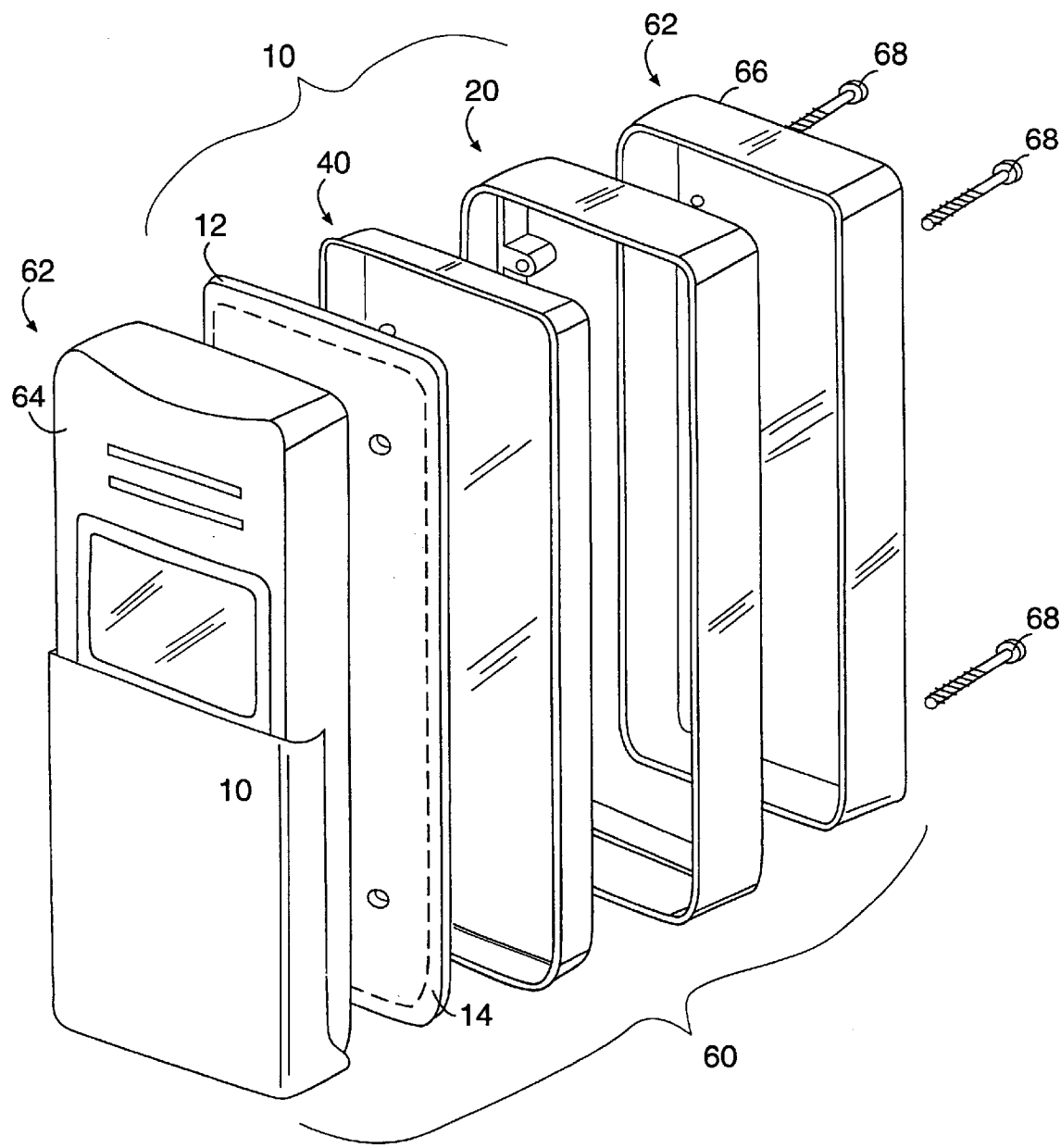
FIG. 3 is an exploded perspective view of a phone incorporating the electromagnetic shield of the present invention.

Referring now to FIG. 3, the electromagnetic shield 10 of the present invention is shown incorporated into a radiotelephone 60. The radiotelephone includes a housing 62 which includes a front cover 64 and a back cover 66. The shield assembly 10 and printed circuit board 12 are interposed between the front cover 64 and back cover 66. The frame 20 of the shield assembly 10 thus forms the center part of the housing 62. The front cover 64, back cover 66, printed circuit board 12, and shield assembly 10 are held together by screws 68 which extend from the back cover 66 and thread into holes (not shown) in the front cover 64. When the screws 68 are tightened the frame 20 of the shield assembly 10 is pressed into contact with the printed circuit board 12 which includes a ground trace 14 extending around the perimeter thereof. Thus, the shield assembly 10 is grounded.

Figure 4:
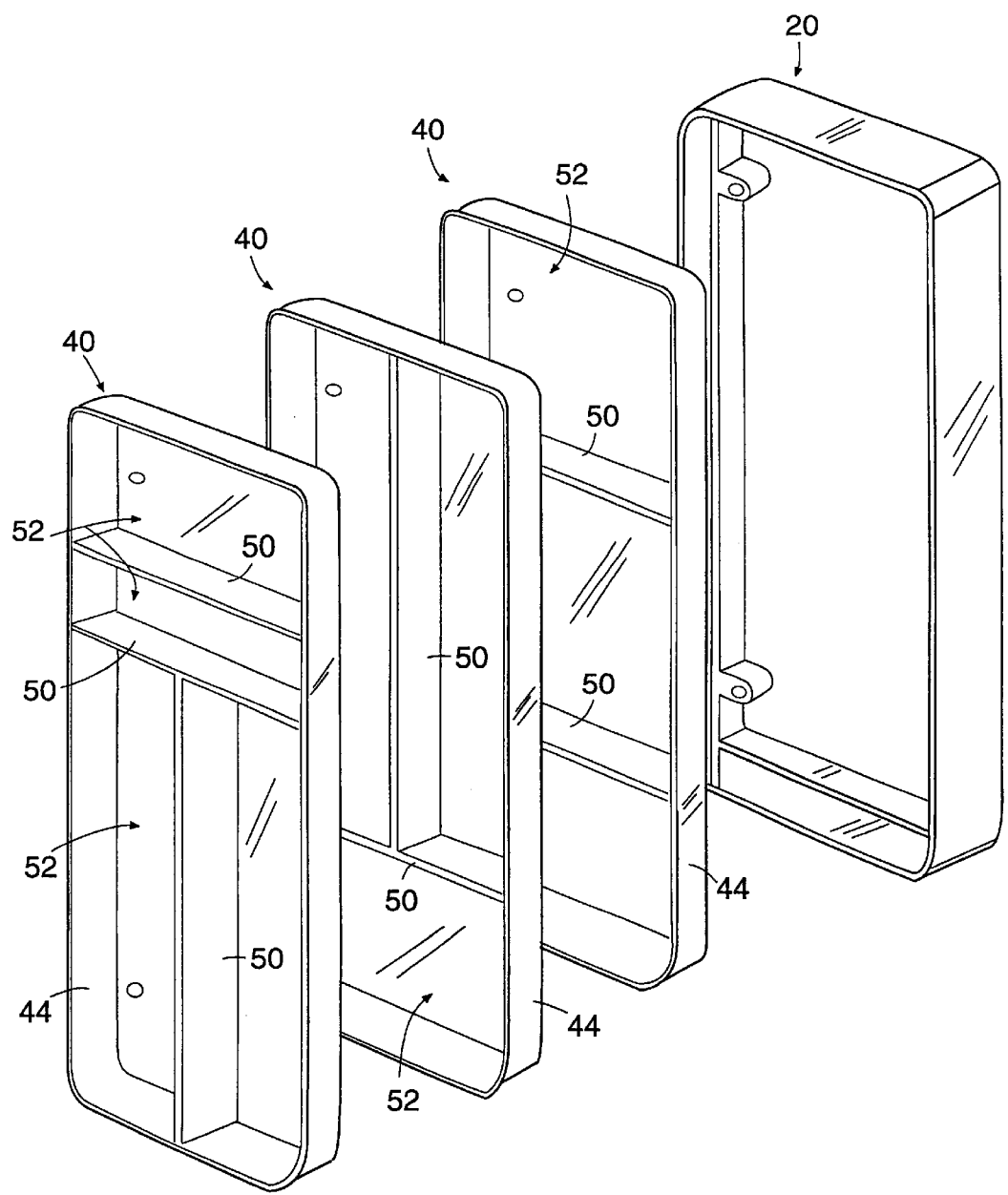
FIG. 4 is a perspective view showing the first embodiment with a plurality of interchangeable shield inserts.

In some cases, it may be desirable to compartmentalize areas of the printed circuit board 12 to isolate specific circuits from one another to prevent internal interference within the phone. This may be accomplished in the present invention by forming a shield insert 40 having one or more interior walls 50 that divide the area underneath the shield 10 into a plurality of compartments 52. A shield assembly 10 having a compartmentalized shield insert 40 is shown in FIG. 4.

In this embodiment, the frame 20 and shield insert 40 are identical to the first embodiment, except that the shield insert 40 has one or more interior walls 50. The interior walls 50 divide the area underneath the shield 10 into a plurality of compartments 52. It will be apparent to those skilled in the art, that one advantage of the present invention is that a different insert 40 can be designed for different mobile phones which all fit into the same standardized frame 20. FIG. 4, for example, shows three different shield inserts 40 having different shield geometries which all fit into the same standard frame 20. This interchangeability allows the same frame 20 to be used for multiple phones greatly reducing cost and time for developing new models. Moreover, since the frame 20 can be standardized and used in a plurality of models, there will be a reduction in the number of parts which must be maintained in inventory further reducing cost.

Figure 5:
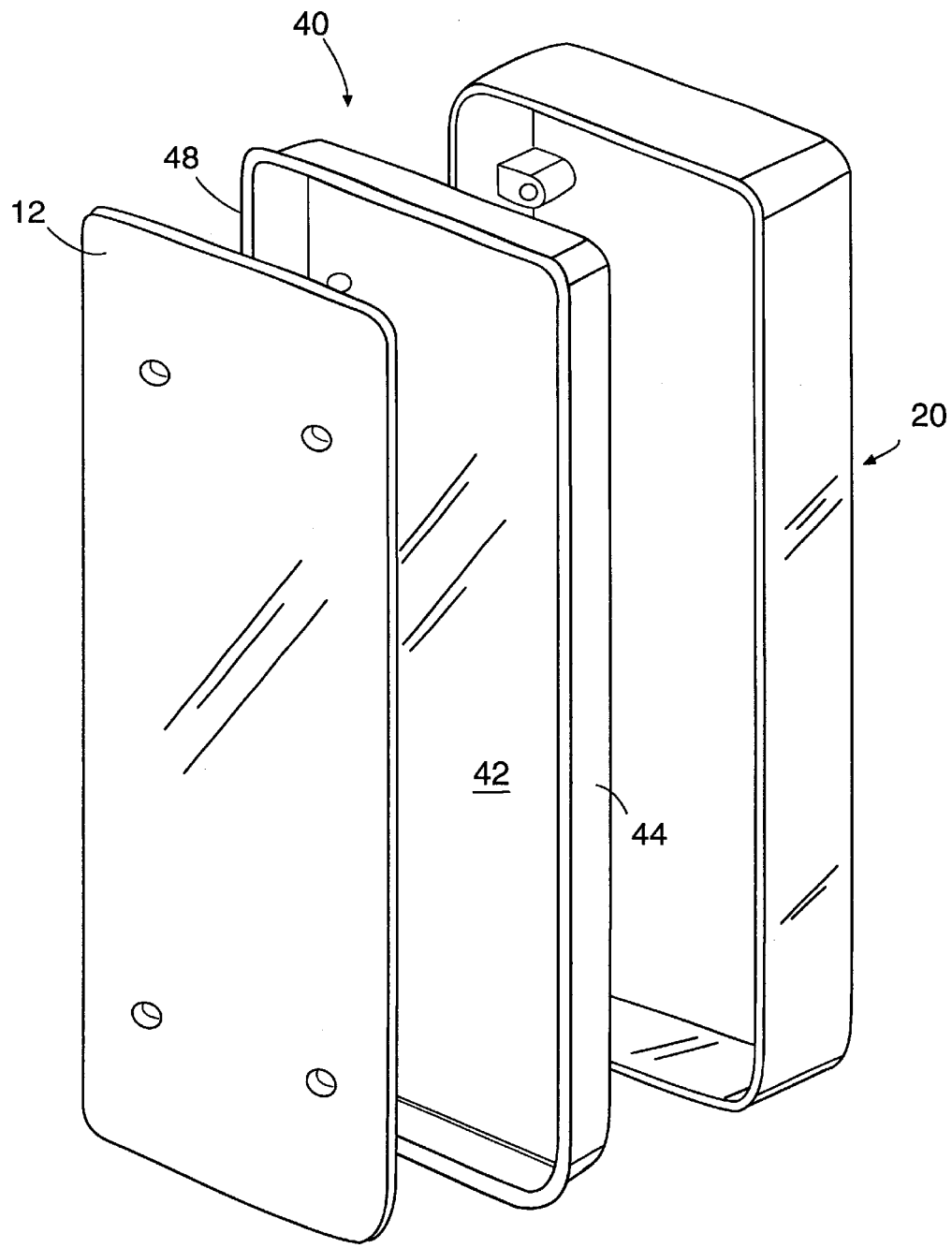
FIG. 5 is a perspective view showing a second embodiment of the electromagnetic shield.
Figure 6:
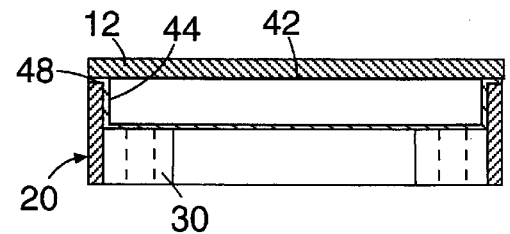
FIG. 6 is a section view showing the second embodiment of the electromagnetic shield.

Referring now to FIGS. 5 and 6, a second embodiment of the shield assembly 10 is shown. This embodiment includes a frame 20 and shield insert 40 substantially as described above. The shield assembly 10 in the second embodiment differs from the first embodiment in several respects. First, the frame 20 of the second embodiment lacks a shoulder 28 on the inner surface of the wall structure 22. In all other respects, the frame 20 of the second embodiment is identical to the frame 20 of the first embodiment. The shield insert 40 is substantially the same as the first embodiment except that a flange 48 extends outwardly from the side wall 44. In all other respects, the shield insert 40 is the same as the first embodiment.

In the second embodiment, the flange 48 of the shield insert 40 rests on the top edge of the frame 20 when the shield insert 40 is inserted into the frame 20. Thus, the flange 48 serves to vertically locate the shield insert 40 in the second embodiment. When the radiotelephone 60 is assembled, the flange 48 of the shield insert 40 is sandwiched between the frame 20 and the printed circuit board 12 as can be clearly seen in FIG. 6. This embodiment thus provides intimate contact between the shield insert 40 and the ground trace 14 of the printed circuit board 12.

Figure 7:
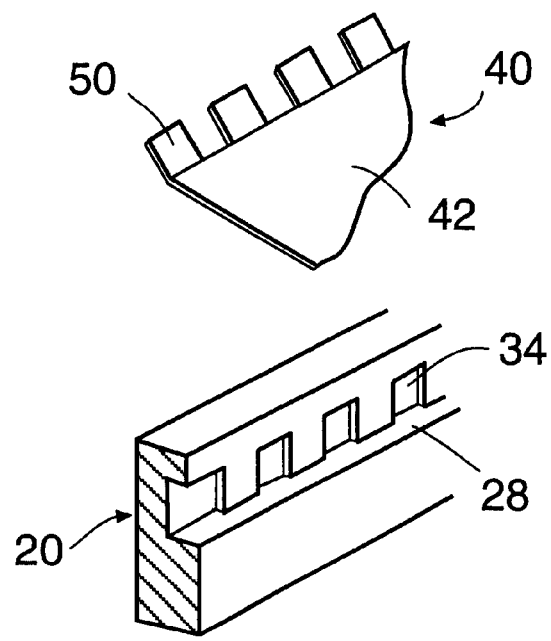
FIG. 7 is a partial perspective view showing a third embodiment of the electromagnetic shield.
Figure 8:
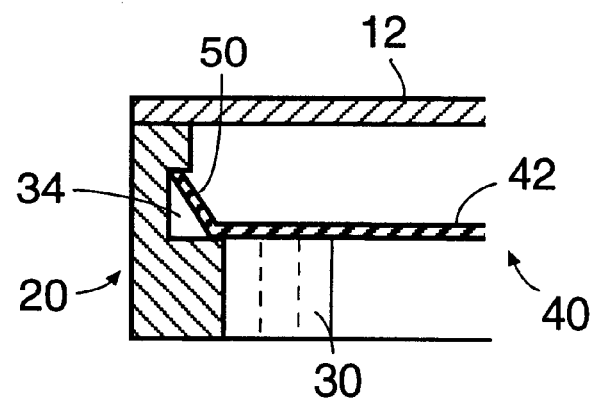
FIG. 8 is a section view showing the third embodiment of the electromagnetic shield.

Referring now to FIG. 7 and 8, a third embodiment of the shield assembly 10 is shown. This embodiment is similar to the first embodiment with a few significant differences. In this embodiment, the frame 20 includes a series of undercuts 34 on the inner surface of the wall structure 22. The shield insert 40, rather than having a side wall 44, includes a series of angled tabs 50 along the edges of the bottom wall 42. The shield insert 40 fits into the frame 20 so that the tabs 50 engage the undercuts 34 in the frame 20 as can be clearly seen in FIG. 8. The engagement of the shield insert tabs 50 in the frame undercuts 34 effectively locks the shield insert 40 into the frame 20.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A radiotelephone comprising:
   a) a housing including a front cover and a back cover;
   b) a printed circuit board contained within the housing, said printed circuit board including a ground trace extending around a perimeter thereof;
   c) a shield assembly disposed adjacent to the printed circuit board, the shield assembly including:
      i) a frame; and
      ii) a shield insert made from an electrically conductive material held by the frame, said shield insert having a flange extending outwardly from a side wall, wherein said flange is contained between said frame and said printed circuit board and contacts said ground trace.

2. The shield according to claim 1 wherein the shield insert is removable.

3. The shield according to claim 2 including a plurality of interchangeable shield inserts.

4. The shield according to claim 1 wherein the shield insert includes a bottom wall and a side wall extending along a perimeter of the bottom wall.

5. The shield according to claim 4 wherein the side wall frictionally engages the interior surface of the frame to retain the shield insert within the frame.

6. The shield according to claim 4 wherein the shield insert further includes a support flange extending outwardly from the side wall for engaging a top or bottom surface of the frame.

7. The shield according to claim 1 wherein the frame includes an interior surface having a stop for locating the shield insert.

8. The shield according to claim 7 wherein the shield further includes locking means to retain the shield in the frame after the shield is inserted into the frame.

9. The shield according to claim 8 wherein the locking means includes one or more undercuts formed in the frame above the stop and one or more tabs on the shield insert that engage the undercuts in the frame.

10. An electromagnetic shield for a radiotelephone, said electromagnetic shield comprising:

a standard frame adapted for use in a plurality of different radiotelephone models, said frame further adapted to receive a plurality of different shield inserts from a group of interchangeable shield inserts;

a shield insert selected from said group of interchangeable shield inserts, each shield insert in said group of interchangeable shield inserts being configured for use in a different radiotelephone model;

wherein the combination of said frame and said selected shield insert forms an application-specific electromagnetic shield for a radiotelephone.

11. The electromagnetic shield of claim 10 wherein said frame further includes a shoulder, each of said shield inserts sized to fit within said frame and be positioned on said shoulder.

12. The electromagnetic shield of claim 10 wherein said frame is generally rectangular shaped and each of said plurality of shield inserts has a generally rectangular shape.

13. The electromagnetic shield of claim 10 wherein said shield inserts include an outwardly extending flange that mounts onto said frame.

14. The electromagnetic shield of claim 10 wherein said frame includes undercuts that mate with tabs extending from said shield inserts.

15. The electromagnetic shield of claim 10 further including screw sleeves extending from said frame for supporting said shield inserts.

* * * * *